US010179948B2

(12) United States Patent
Snyder et al.

(10) Patent No.: US 10,179,948 B2
(45) Date of Patent: Jan. 15, 2019

(54) METHOD AND SYSTEM FOR CONTROLLING COATING IN NON-LINE-OF-SIGHT LOCATIONS

(71) Applicant: UNITED TECHNOLOGIES CORPORATION, Hartford, CT (US)

(72) Inventors: Brooks E Snyder, Glastonbury, CT (US); Thomas J Martin, East Hampton, CT (US); Thomas N Slavens, Vernon, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 14/689,461

(22) Filed: Apr. 17, 2015

(65) Prior Publication Data
US 2015/0307990 A1 Oct. 29, 2015

Related U.S. Application Data

(60) Provisional application No. 61/983,597, filed on Apr. 24, 2014.

(51) Int. Cl.
C23C 16/48 (2006.01)
F01D 5/28 (2006.01)
C23C 16/455 (2006.01)
C23C 16/40 (2006.01)
C23C 16/04 (2006.01)

(52) U.S. Cl.
CPC .......... C23C 16/483 (2013.01); C23C 16/045 (2013.01); C23C 16/047 (2013.01); C23C 16/405 (2013.01); C23C 16/45517 (2013.01); C23C 16/45582 (2013.01);
(Continued)

(58) Field of Classification Search
CPC ... C23C 16/045; C23C 16/047; C23C 16/481; C23C 16/483; C23C 16/45517; C23C 16/45582; C23C 16/488
USPC ....... 427/554, 555, 556, 582, 583, 584, 585, 427/586
See application file for complete search history.

(56) References Cited

U.S. PATENT DOCUMENTS 4,859,496 A * 8/1989 Toyonaga ............. C23C 16/047 427/126.3
5,060,595 A * 10/1991 Ziv ....................... C23C 16/047 118/722
(Continued)

FOREIGN PATENT DOCUMENTS

GB 2212819 A 8/1989
WO 2012072475 A2 6/2012
(Continued)

OTHER PUBLICATIONS

Webster's Ninth New Collegiate Dictionary; Merriam-Webster inc.; Springfield, Massachusetts, USA; 1990 (no month); excerpt p. 105.*

Primary Examiner — Marianne L Padgett
(74) Attorney, Agent, or Firm — Bachman & LaPointe, P.C.

(57) ABSTRACT

A method for coating a turbine engine component, said method includes the steps of: placing the component into a chamber; injecting a non-reactive carrier gas containing a coating material into the chamber; and forming a coating on a desired portion of the component by locally heating the desired portion of the component by redirecting a directed energy beam onto the desired portion of the component.

4 Claims, 7 Drawing Sheets

(52) U.S. Cl.
CPC ............ *C23C 16/481* (2013.01); *F01D 5/284* (2013.01); *F01D 5/288* (2013.01); *F05D 2230/13* (2013.01)

(56) References Cited

U.S. PATENT DOCUMENTS

| | | | |
|---|---|---|---|
| 5,174,826 A * | 12/1992 | Mannava | C23C 16/047 118/715 |
| 5,212,118 A * | 5/1993 | Saxena | C23C 16/4405 148/DIG. 118 |
| H1264 H * | 12/1993 | Epler | C23C 16/52 117/103 |
| 5,276,012 A * | 1/1994 | Ushida | H01L 39/2441 427/126.3 |
| 5,547,716 A | 8/1996 | Thaler | |
| 5,618,580 A * | 4/1997 | Oshima | B01J 12/02 118/715 |
| 5,648,114 A * | 7/1997 | Paz De Araujo | C23C 16/0218 427/126.3 |
| 5,786,023 A * | 7/1998 | Maxwell | C23C 26/00 264/40.1 |
| 5,847,357 A | 12/1998 | Woodmansee et al. | |
| 5,952,047 A * | 9/1999 | Tasaki | C07F 3/003 427/252 |
| 6,033,721 A * | 3/2000 | Nassuphis | C23C 16/047 356/2 |
| 6,751,516 B1 * | 6/2004 | Richardson | B22F 3/1055 700/118 |
| 7,094,475 B2 | 8/2006 | Schnell et al. | |
| 8,541,069 B2 | 9/2013 | Greenberg et al. | |
| 9,499,909 B2 * | 11/2016 | Moffatt | C23C 16/483 |
| 9,845,524 B2 * | 12/2017 | Snyder | C23C 4/01 |
| 2004/0234687 A1 * | 11/2004 | Schmid | C23C 4/12 427/248.1 |
| 2005/0129965 A1 * | 6/2005 | Barbezat | C23C 14/083 428/469 |
| 2005/0249888 A1 * | 11/2005 | Makhotkin | C23C 14/042 427/585 |
| 2008/0175988 A1 * | 7/2008 | Chiu | C03C 17/22 427/163.2 |
| 2008/0220177 A1 * | 9/2008 | Hass | C23C 14/0021 427/446 |
| 2010/0176097 A1 | 7/2010 | Zhu | |
| 2012/0258256 A1 * | 10/2012 | Greenberg | C23C 14/044 427/523 |
| 2013/0269611 A1 | 10/2013 | Greenberg et al. | |
| 2014/0273416 A1 * | 9/2014 | Moffatt | C23C 16/483 438/478 |
| 2015/0003997 A1 * | 1/2015 | Mironets | B22F 5/009 416/241 R |
| 2015/0322563 A1 * | 11/2015 | Snyder | C23C 14/042 427/448 |
| 2015/0345396 A1 * | 12/2015 | Zelesky | F01D 5/187 60/806 |
| 2016/0108739 A1 * | 4/2016 | Musto | F01D 5/186 416/97 R |
| 2016/0319678 A1 * | 11/2016 | Staroselsky | B29C 67/0077 |
| 2016/0326880 A1 * | 11/2016 | Slavens | C30B 29/607 |
| 2016/0369400 A1 * | 12/2016 | Maxwell | C04B 35/58 |

FOREIGN PATENT DOCUMENTS

| | | |
|---|---|---|
| WO | 2013061085 A1 | 5/2013 |
| WO | 2013061086 A1 | 5/2013 |

\* cited by examiner

METHOD AND SYSTEM FOR CONTROLLING COATING IN NON-LINE-OF-SIGHT LOCATIONS

CROSS REFERENCE TO RELATED APPLICATION

This application claims the benefit of provisional application Ser. No. 61/983,597, filed Apr. 24, 2014.

BACKGROUND

The present disclosure is directed to a method and system for controlling the formation of a coating on non-line-of-sight locations on turbine engine components such as turbine airfoils.

In the pursuit of ever higher efficiencies, gas turbine engine manufacturers have relied on higher and higher turbine inlet temperatures to provide boosts to overall engine performance. In typical modern engine applications, the gas path temperatures within the turbine may exceed the melting point of the component constituent materials. Due to this possibility, dedicated cooling air is extracted from the compressor and used to cool the gas path components, including rotating blades and stator vanes, in the turbine. As a result, significant cycle penalties may be incurred.

The components of the turbine stages (e.g. vanes and blades) should be able to withstand the thermal and oxidation conditions of the high temperature combustion gas during the course of operation. To protect turbine engine components from the extreme conditions, surfaces exposed to hot combustion gases are coated with metallic bond coats that provide oxidation and corrosion resistance, and with thermal barrier coatings (TBC) that provide thermal protection. Thermal protection is provided by a low thermal conductivity ceramic top coat that decreases the heat flux into the part. Hot section part coatings are often multilayer systems that include a thermally insulating porous ceramic overlay deposited on top of various interface layers that provide thermal and environmental protection and bonding to the metal alloy substrate. The total thickness of all coatings varies between approximately 0.005 to 0.020 inches thick. TBC layers are typically made up of yttria partially-stabilized zirconia (YSPZ). The TBC has a very high melting temperature and low thermal conductivity and is resistant to oxidation and corrosion and has good phase stability. Modern TBCs can provide an extra 300° F. reduction in metal temperature; however, the TBC allows oxygen to freely diffuse through it, therefore, it does not provide any addition EBC benefit versus oxidation. In addition, the thermal expansion coefficient of the TBC should be similar to that of the alloy; otherwise the mismatch can induce cracking and spallation during thermal cyclic operation.

In order to protect the turbine components constructed from nickel-based superalloy, environmental barrier coatings (EBC), usually metallic aluminide or platinum aluminide approximately 0.002-0.004 in thick, provide oxidation and corrosion protection. The most common is NiCoCrAlY, containing 12% aluminum. Chromide coatings provide good protection for high Cr base alloys against corrosion due to molten salts, pollutants, and sands in the environment.

Aluminide bond coatings, or diffusion coatings, are a class of EBCs for nickel-based superalloys that are used in multilayered coating systems underneath ceramic overlays. TBCs are deposited on top of an alumina forming metallic bond coat that acts as an interface between the TBC and the superalloy substrate. The bond coat is used both for protection against oxidation, and to improve adherence to the metal substrate. The ceramic overlay TBC provides thermal protection while the interface bond EBC provides environmental protection to improve resistance against oxidation and corrosion. The aluminum improves the bond of the ceramic top coat to the metallic alloy substrate. The aluminide coating also acts as a reservoir of aluminum to reduce diffusion of Al to the surface. They typically are 0.002 in thick bond coat with an inter-diffusion layer approximately 0.002 in thick. The diffusion layer is non-load carrying.

Referring now to FIG. 1, there is shown a vane cluster 10 having a plurality of airfoils 12. Each airfoil 12 may interfere with the application of a coating to an adjacent airfoil(s) 12, in the regions 14. This is because the vane cluster geometry provides a mask which affects coating distribution on the hidden faces of the airfoils 12 in the regions 14, thereby reducing the amount of coating which is applied to those areas. Such non-uniformity may be further exacerbated by the absence of interference to the application of the coating on the surfaces at each end of the vane cluster. This is true even when so-called non-line of sight coating application methods, such as electron beam physical vapor deposition (EB-PVD), are used. The hidden areas may not receive adequate coating thickness due to the exposed areas on either end of the vane cluster reaching the coating thickness limit, thereby creating non-uniformity of coating profiles from vane to vane. The varying coating distribution between the two airfoils creates a situation of mismatched thermal gradients and thermal growth.

Additive layer manufacturing (ALM) devices, such as direct metal laser sintering (DMLS), selective laser melting (SLM), laser beam melting (LBM) and electron beam melting (EBM), provide for the fabrication of complex metal, alloy, polymer, ceramic and composite structures by the freeform construction of the material, layer by layer. The principle behind additive manufacturing processes involves the selective melting of atomized precursor powder beds by a directed energy source, producing the lithographic build up of material. The melting of the powder occurs in a small localized region of the energy beam, producing small volumes of melting, called melt pools, followed by rapid solidification, allowing for very precise control of the solidification process in the layer-by-layer fabrication of the material. These devices are directed by three-dimensional geometry solid models developed in computer aided design (CAD) software systems. This allows for the fabrication of very complex and multifunctional components from a wide variety of precursor materials.

Laser Chemical Vapor Deposition (LCVD) is an additive manufacturing process that a solid deposit is formed from gaseous reactants which uses a laser to heat the substrate and enhance the surface reactions in a desired location. Building off of the chemical deposition process, the LCVD pyrolytic process utilizes a non-reacting gas field to transport a target material onto a high temperature substrate. Referring now to FIG. 2, there is shown a laser CVD apparatus which includes: mass flow controller 1, precursor evaporator 2, optical lens 3, quartz window 4, substrate holder 5, and substrate 6. Referring now to FIG. 3, LCVD utilizes a laser 30 within the gas field to locally enhance surface reactions for the directed deposition of coating material along the target surface 32. This allows for controlled growth of the target material onto the substrate 32. The LCVD process has been utilized since the early 1970s to create small feature objects such as carbon nanotubes. Relative to powder bed systems such as DMLS or electron beam melting machines, LCVD utilizes a maskless process that does not need oscillatory material layering. Further, as a consequence of the gaseous material transport, the deposited material is much more pure than a powder deposition dependent process and does not suffer from deposit degradation as similar additive processes such as delamination or high porosity. Another unique deposit characteristic in LCVD is to make conformal deposits 40 on concave or convex substrates 42 results in conformal layers 44 such as shown in FIG. 4A that conform to non-planar substrates 42. In comparison, powderbed/powder deposition techniques as shown in FIG. 4B form planar layers 46 on the non-planar substrate 48.

SUMMARY

In accordance with the present disclosure, there is provided a method for coating a turbine engine component, which method broadly comprises the steps of: placing the component into a chamber; injecting a non-reactive carrier gas containing a coating material into the chamber; and forming a coating on a desired portion of the component by locally heating the desired portion of the component by redirecting a directed energy beam onto the desired portion of the component.

In another and alternative embodiment, the redirecting step may comprise articulating a redirecting surface so that the directed energy beam is directed onto the desired portion of the component.

In another and alternative embodiment, the method may further comprise causing the redirecting surface to raster across the desired portion.

In another and alternative embodiment, the articulating step may comprise articulating a mirror.

In another and alternative embodiment, the injecting step may comprise injecting a gas containing materials for forming one of a bond coating, a thermal barrier coating, an environmental coating, and a ceramic metallic coating.

In another and alternative embodiment, the method may further comprise maintaining the non-reactive carrier gas containing the coating material at a temperature lower than the deposition temperature of the coating material.

In another and alternative embodiment, the component placing step may comprise placing a turbine vane pack having a plurality of airfoils in the chamber.

In another and alternative embodiment, the coating forming step may comprise forming a coating on hidden portions of the airfoils.

In another and alternative embodiment, the method may further comprise providing a laser for generating a laser beam; and the redirecting step may comprise redirecting the laser beam onto the desired portion of the component.

Further in accordance with the present disclosure, there is provide a system for coating a turbine engine component, which system broadly comprises: a chamber for holding the component to be coated; a non-reactive carrier gas containing a coating material to be injected into the chamber; a directed energy beam source for generating an energy beam; and a redirecting surface for redirecting the energy beam onto a desired portion of the component.

In another and alternative embodiment, the chamber may have an inlet for the non-reactive carrier gas.

In another and alternative embodiment, the chamber may have a transparent layer through which the energy beam is directed to the redirecting surface.

In another and alternative embodiment, the coating material may comprise one of a bond coating material, a thermal barrier coating material, an environmental coating material, and a ceramic environmental coating material.

In another and alternative embodiment, the directed energy beam source may comprise a laser for generating a laser beam.

In another and alternative embodiment, the redirecting surface may comprise an articulated redirecting surface for redirecting the energy beam so that a desired portion of the component is locally heated.

In another and alternative embodiment, the articulated redirecting surface may be attached to a wall of the chamber.

In another and alternative embodiment, the component may comprise a turbine vane pack having a platform and a plurality of airfoils having hidden portions to be coated.

In another and alternative embodiment, the redirecting surface may comprise a mirror.

Other details of the method and system for controlling coating in non-line of sight locations are set forth in the following detailed description and the accompanying drawings, wherein like reference numerals depict like elements.

DETAILED DESCRIPTION

As described herein, the present disclosure relates to a LCVD method and system that distributes a coating to hidden portions of a gas turbine engine component, such as an airfoil vane pack, a turbine blade, and other hot section components that are difficult to coat. The method and system described herein are useful for coating complex shaped parts because it allows one to locally control the coating thickness distribution to be either more uniform or thicker in areas where it is needed and thinner in other areas.

Figure 1:
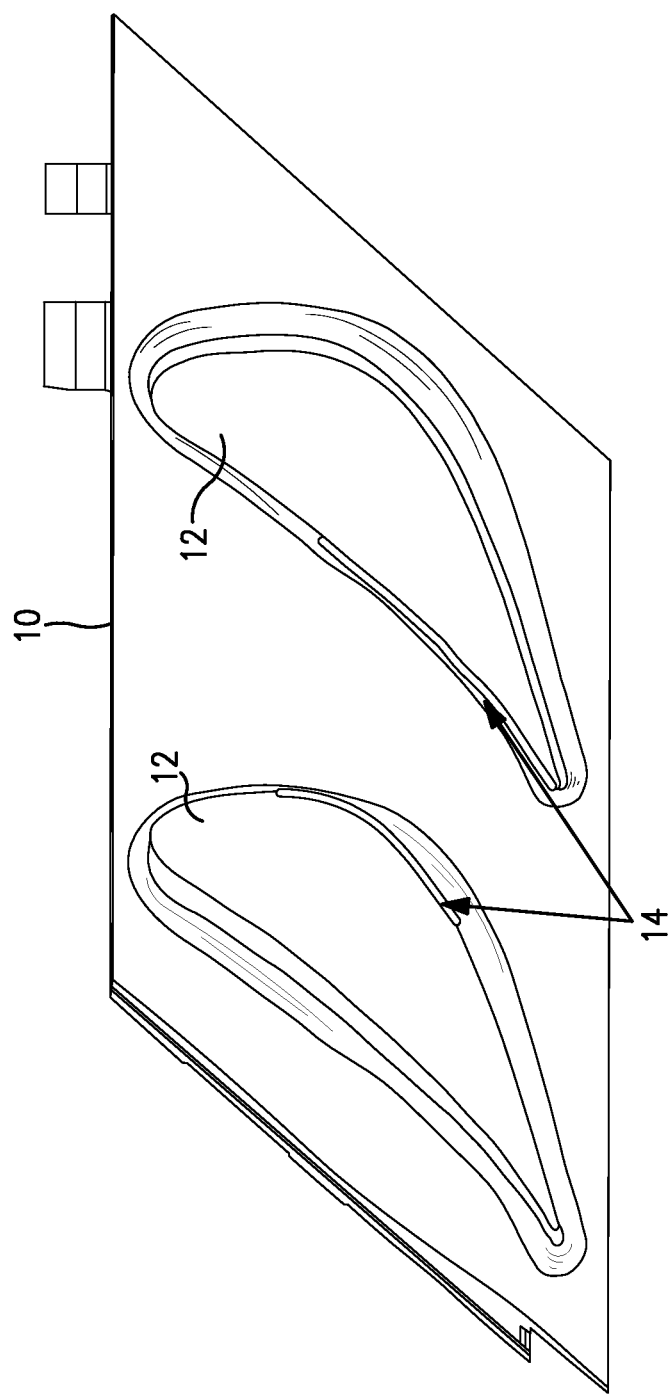
FIG. 1 is a schematic representation of a portion of a vane cluster showing shadowed regions.
Figure 2:
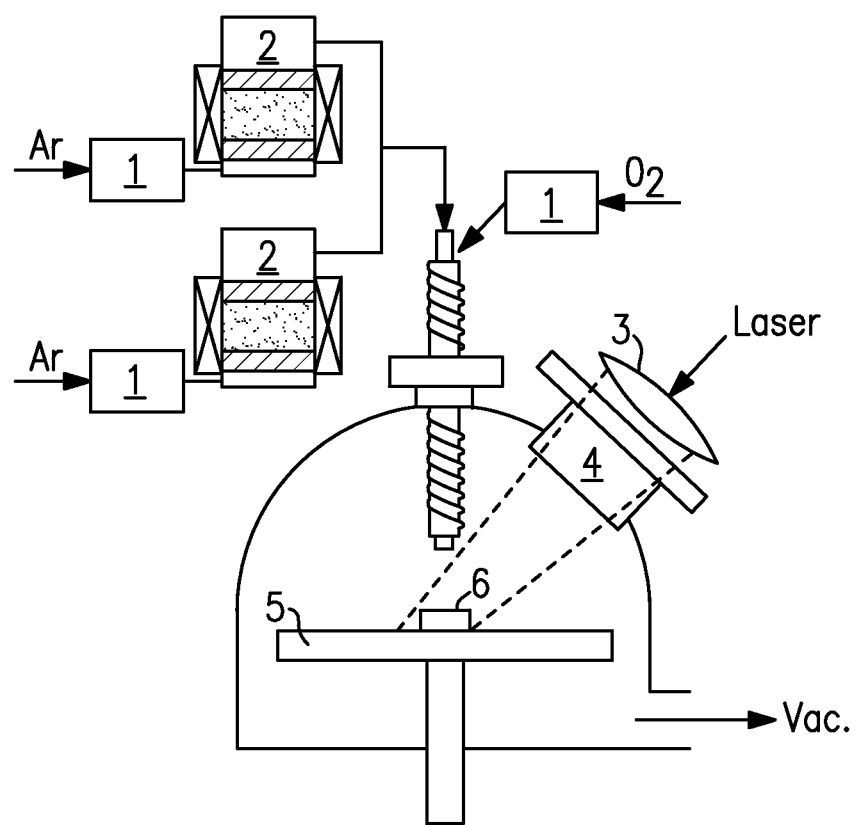
FIG. 2 is a schematic representation of a deposition process showing gasification of pure silicon.
Figure 3:
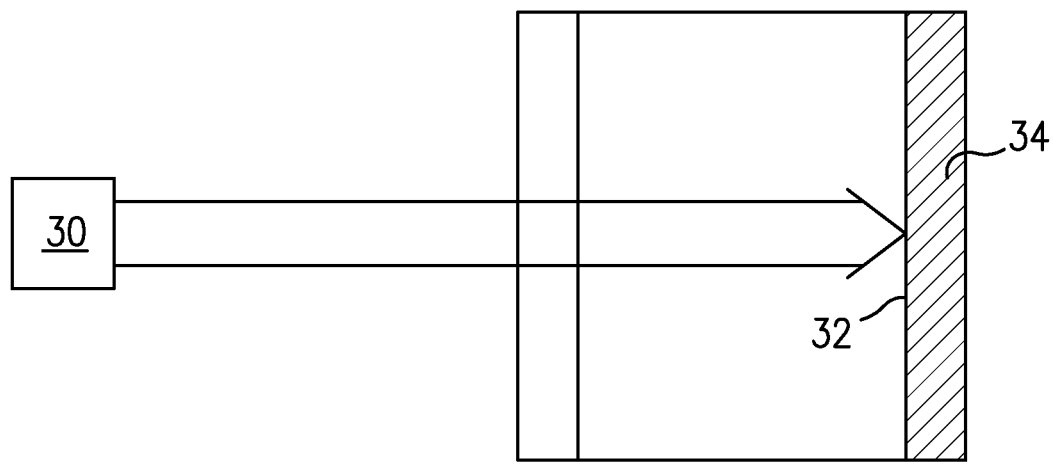
FIG. 3 is a schematic representation of a LCVD deposition process.
Figure 4A:
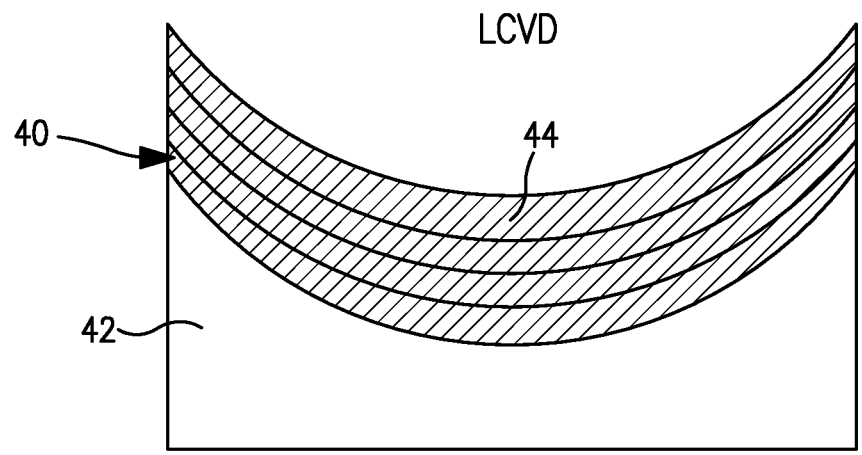
FIGS. 4A and 4B illustration between the conformal layers formed using an LCVD deposition process and the planar layers formed using a powderbed/powder deposition process.
Figure 4B:
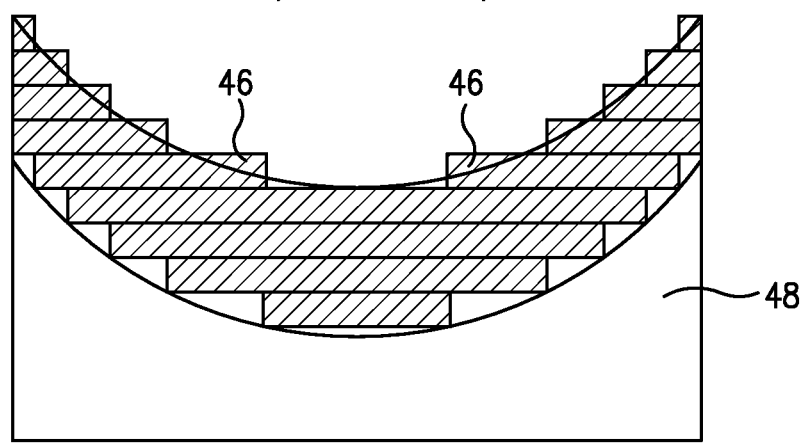

As shown in FIG. 1, typical double vane packs have a portion 14 that does not lend itself to being coated using traditional coating processes of direct plasma spray or electron-beam vapor deposition.

Figure 5:
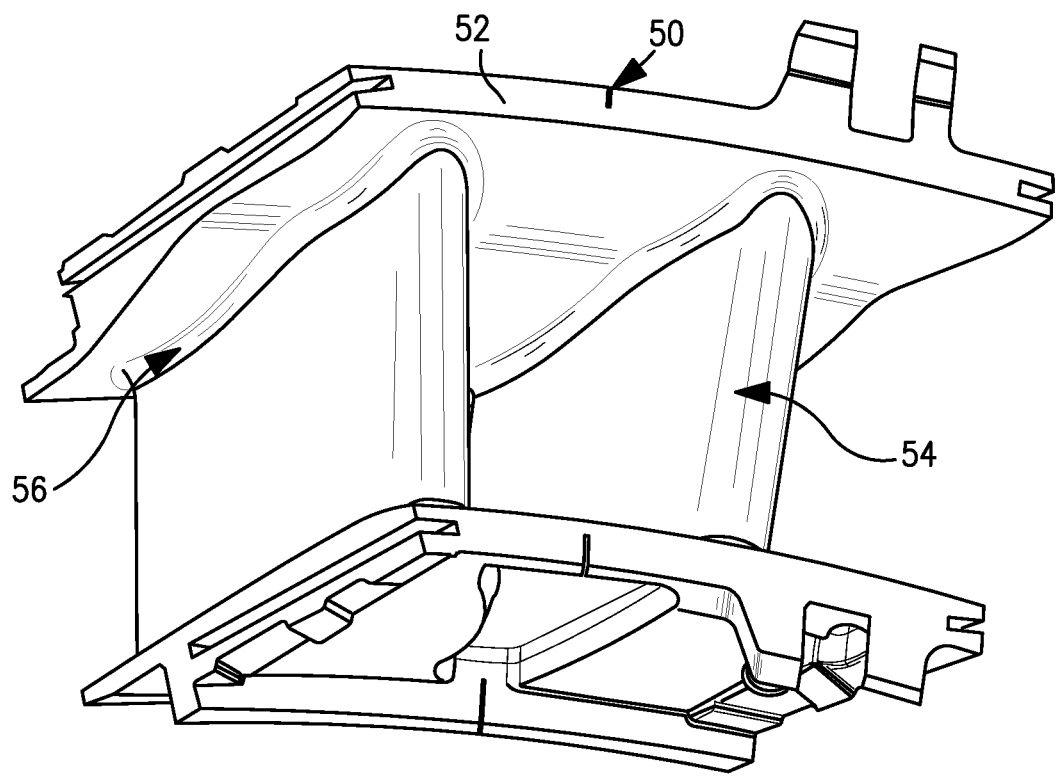
FIG. 5 is a perspective view of a turbine vane pack.

FIG. 5 illustrates a turbine vane pack 50 to be coated. While the present disclosure will be presented in the context of forming a coating on hidden portions of a turbine vane pack, as discussed above, the method and system described herein can be used to coat other gas turbine engine components such as turbine blades, turbine airfoils, and other hot section components that are difficult to coat. The turbine vane pack 50 includes a platform 52, a plurality of airfoils 54, and a fillet region 56. The turbine vane pack 50 and its elements may be formed from any suitable material known in the art, such as a metal, a metal alloy, a monolithic ceramic material, or a composite material (e.g. a ceramic matrix composite material). The turbine vane pack 50 may be formed from one of these materials or a combination of these materials.

Figure 6:
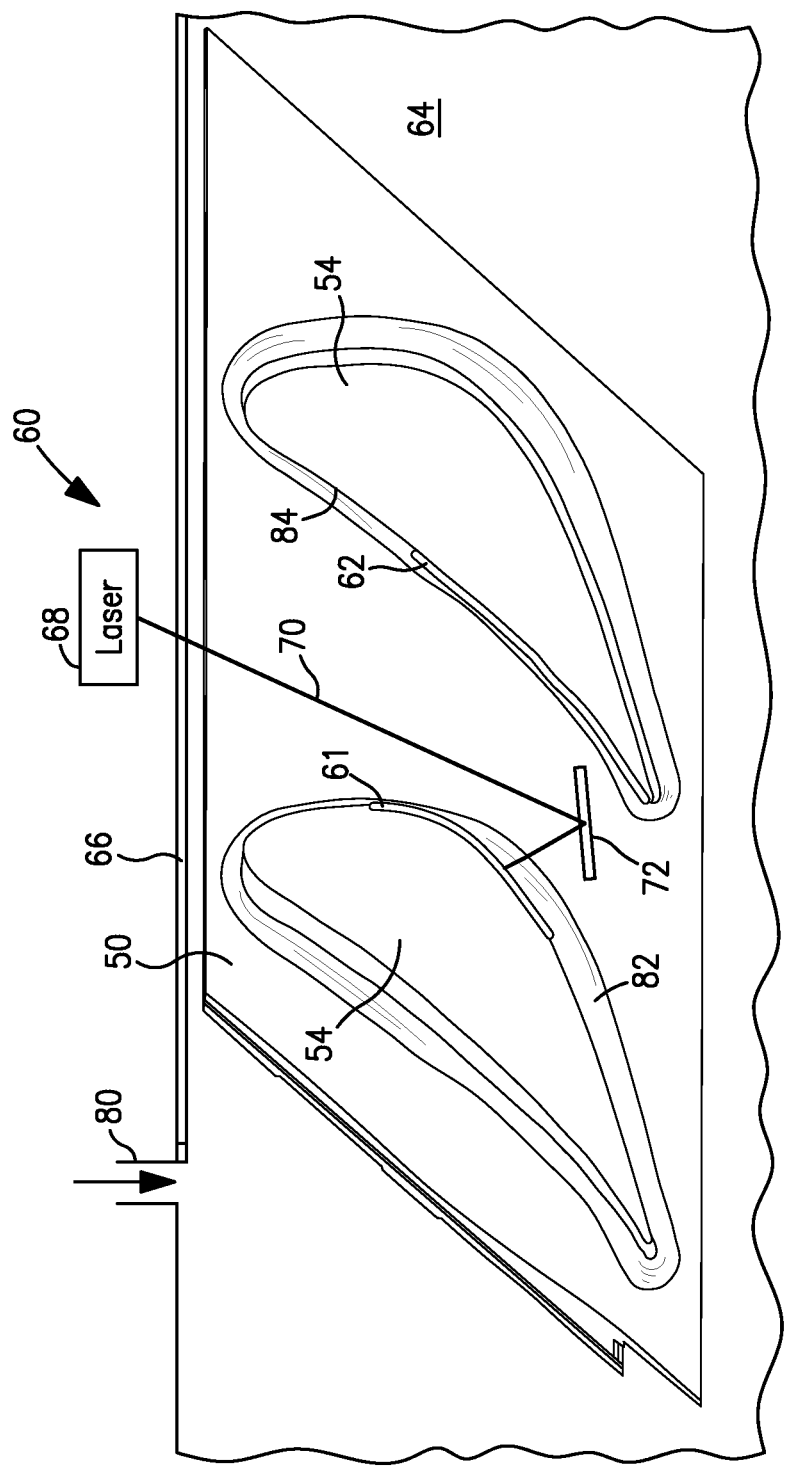
FIG. 6 is a schematic representation of a system for applying a protective coating to hidden areas of the turbine vane pack of FIG. 5.
Figure 7:
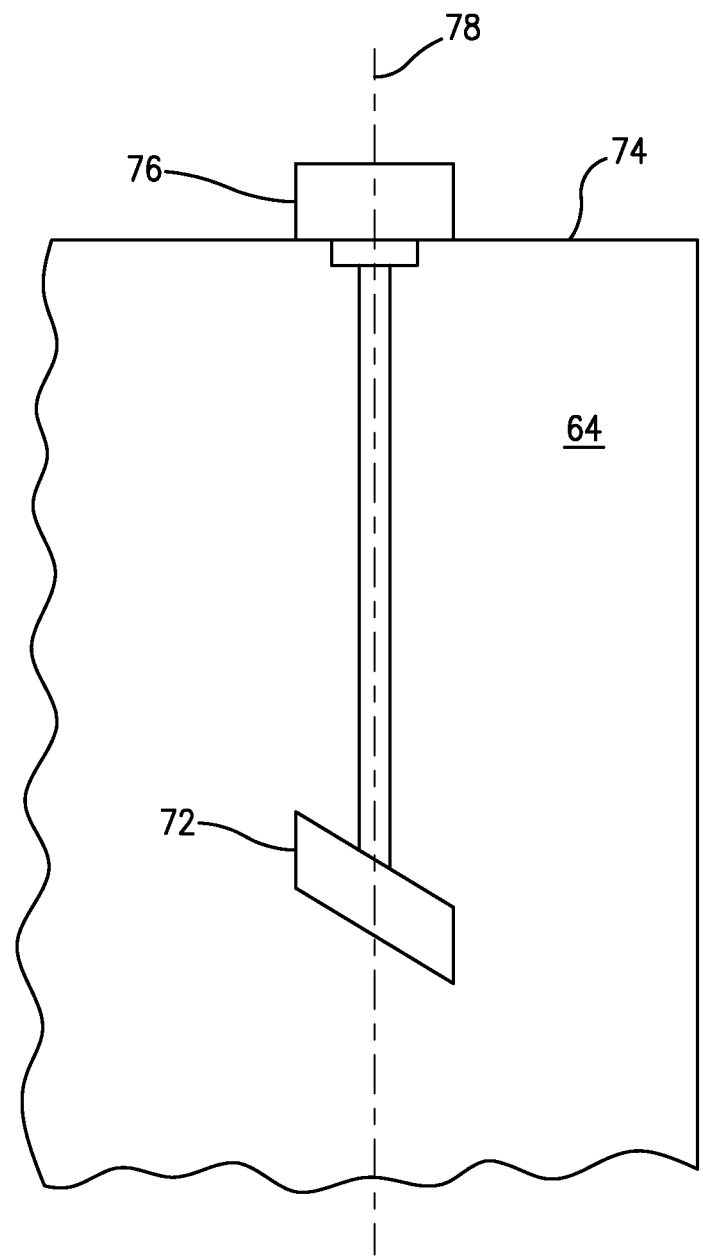
FIG. 7 illustrates a schematic representation of a portion of the system of FIG. 6.

FIG. 6 illustrates a system 60 in accordance with the present disclosure for applying a coating to hidden portions 61 and 62 of the component being coated such as the airfoils 54 of the turbine vane pack 50. The system 60 includes a chamber 64 having a transparent layer 66. The turbine vane pack 50 to be coated is placed within the chamber 64. The system 60 further includes a directed energy source 68, such as a laser. The directed energy source 68 applies an energy beam 70 through the transparent layer 66. Mounted within the chamber 64 is an articulated redirecting surface 72 such as a mirror. The redirecting surface 72 may be used to reflect the energy beam 70 or cause refraction of the energy beam 70. As shown in FIG. 7, the redirecting surface 72 may be mounted to a wall 74 of the chamber 64. A device 76 for rotating the articulated redirecting surface 72 about an axis 78 may also be provided. Still further, the redirecting surface 72 may be adapted to rotate and otherwise move about multiple axes so that the desired coating may be achieved. For example, the redirecting surface 72 may be mounted so that it can move in two axes at an angle to the axis 78.

The system 60 further includes an inlet 80 for injecting into the chamber 64 a non-reacting material carrier gas containing a material or materials to be deposited onto the hidden portions 61 and 62. The gas is injected into the chamber 64 so that the turbine vane pack 50 is immersed in a non-reacting gas cloud at a temperature subsequently lower than the deposition temperature of the constituent material for forming the desired coating on the hidden portions 61 and 62.

During the coating process, an energy beam 70 from the directed energy source 68, such as a laser beam from a laser, is shot at the redirecting surface 72 and reflected to a desired location on one of the surfaces 82 and 84 of the airfoils 54 where the deposition of the coating is desired. The laser strike causes a very high and very local temperature strike on the surface of the one airfoil 54 causing the coating material in the chamber 64 to debond from the carrier gas and deposit on the surface of the airfoil 54. As can be seen from the foregoing discussion, the directed energy source locally applies a coating to the airfoil 54 through local heating of the airfoil surface. As the coating is grown, the redirecting surface 72 is articulated to cause the energy beam 70 to raster across the area where the coating is desired. In this way, the hidden areas 61 and 62 may have a coating applied to them.

The coating material which may be deposited onto the desired surfaces of the airfoil 54 may include a bond coat, a thermal barrier coating, an environmental coating, such as a metallic environmental coating, or a ceramic environmental barrier coating. Coatings which may be formed using the process described herein include yttria partially-stabilized zirconia, aluminides, platinum aluminides, chromides, barium strontium aluminosilicates, yttrium silicates, silicon nitrides, molybdenum, tantalum, titanium, titanium nitrides, niobium oxides, tungsten, and tungsten carbides.

The method described herein may use vaporized zirconium dipivaloylmethanate, Zr(dpm), and yttrium dipivaloylmethanate Y(dpm) as the precursor gas(es). The vaporization temperatures of these are 573° K and 443° K, respectively. The precursors may be delivered by a carrier gas, such as Argon, Ar, with oxygen $O_2$, introduced from a separate nozzle in order to react with Zr and produce zirconia, $ZrO_2$, on a substrate.

The coatings formed by the method and system described herein may have a controlled columnar microstructure through sintering direction. If desired, relative to a concave or convex surface, one can use the directed energy beam angle to produce a column that is not necessarily perpendicular to the surface.

The method and system described herein have a number of benefits. These may include a dramatic increase for part durability in shadowed locations; an increase part life by 2 to 5×; an increase in thrust specific fuel consumption (TSFC) through the turbine inlet temperature (T4) increases due to part capability increases; and better coating performance through the entirety of the part through better conformal application of the coating microstructure.

The method and system described herein allow batch coating of larger amounts of turbine engine components, such as turbine blades, in a more uniform manner without necessarily needing a tertiary motion system.

While the method and system of the present disclosure have been describe in the context of coating hidden portions on airfoils of a turbine vane pack, the method and system could be used to coat hidden portions on other gas turbine engine parts.

There has been described a method and a system for forming controlled coatings in non-line of sight locations. While the method and system have been described in the context of specific embodiments thereof, other unforeseeable alternatives, modifications, and variations may become apparent to those skilled in the art having read the foregoing description. Accordingly, it is intended to embrace those alternatives, modifications, and variations as fall within the broad scope of the appended claims.

What is claimed is:

1. A method for coating a turbine engine component, the component comprising a turbine vane pack having a plurality of airfoils, said method comprising the steps of:

placing said turbine vane pack into a chamber, said chamber having a transparent layer;

utilizing laser chemical vapor deposition by injecting a non-reactive carrier gas containing a vaporized coating material into said chamber, wherein said vaporized coating material consists of at least one of a vaporized zirconium dipivaloylmethanate and yttrium dipivaloylmethanate, wherein said turbine vane pack is immersed in said non-reactive carrier gas and said vaporized coating material;

forming a coating from said vaporized coating material on hidden portions of said plurality of airfoils by locally heating said hidden portions of said plurality of airfoils by applying a laser through said transparent layer, wherein the hidden portions comprise faces of the airfoils masked by a geometry of the turbine vane pack so as to affect coating distribution;

redirecting said laser onto said hidden portions of said plurality of airfoils by moving a surface of a mirror within said chamber, in the absence of a motion system employed on said plurality of airfoils, so that the laser is directed onto said hidden portions of said plurality of airfoils causing local heating of a surface of the hidden portions of said plurality of airfoils; and causing the vaporized coating material in said chamber to deposit on said hidden portions of said plurality of airfoils responsive to said laser being redirected onto said hidden portions of said plurality of airfoils, and making conformal deposits on a concave or a convex surface of said plurality of airfoils resulting in conformal layers.

2. The method of claim 1, further comprising causing said laser to raster across the hidden portions of said plurality of airfoils.

3. The method of claim 1, wherein said injecting step comprises injecting the non-reactive carrier gas containing said vaporized coating material for forming one of a bond coat, a thermal barrier coating, an environmental coating, and a ceramic metallic environmental coating.

4. The method of claim 1, further comprising maintaining said non-reactive carrier gas containing said vaporized coating material at a temperature lower than a deposition temperature of said coating material.

* * * * *